(12) United States Patent
Berndt et al.

(10) Patent No.: US 7,238,541 B2
(45) Date of Patent: Jul. 3, 2007

(54) METHOD OF INCORPORATING MAGNETIC MATERIALS IN A SEMICONDUCTOR MANUFACTURING PROCESS

(75) Inventors: Dale F. Berndt, Plymouth, MN (US);
Andrzej Peczalski, Eden Prairie, MN (US); Eric E. Vogt, Minneapolis, MN (US); William F. Witcraft, Minneapolis, MN (US)

(73) Assignee: Honeywell International Inc., Morristown, NJ (US)

( * ) Notice: Subject to any disclaimer, the term of this patent is extended or adjusted under 35 U.S.C. 154(b) by 43 days.

(21) Appl. No.: 11/182,943

(22) Filed: Jul. 18, 2005

(65) Prior Publication Data

US 2005/0260774 A1   Nov. 24, 2005

Related U.S. Application Data

(62) Division of application No. 10/462,722, filed on Jun. 17, 2003, now abandoned.

(51) Int. Cl.
*H01L 21/00* (2006.01)

(52) U.S. Cl. .................. 438/3; 257/E21.665

(58) Field of Classification Search .......... 257/E21.665
See application file for complete search history.

(56) References Cited

U.S. PATENT DOCUMENTS 5,389,566 A * 2/1995 Lage ........................ 438/3

OTHER PUBLICATIONS

Johnson, Mark, et al., "Hybrid Hall effect device", Applied Physics Letters, vol. 71, No. 7: Aug. 1997.
Johnson, Mark, "Hybrid Ferromagnet-Semiconductor Device for Memory and Logic", IEEE Transactions on Magnetics, vol. 36, No. 5: Sep. 2000.
Johnson, Mark, "Magnetoelectronic memories last and last . . . ", IEEE Spectrum: Feb. 2000.

* cited by examiner

*Primary Examiner*—Lex Malsawma
(74) *Attorney, Agent, or Firm*—McDonnell Boehnen Hulbert & Berghoff LLP

(57) ABSTRACT

A method for incorporating magnetic materials in a semiconductor manufacturing process includes manufacturing a semiconductor device including interlayers and dielectric layers, depositing a magnetic layer above a semiconductor device and forming metallized contacts for connecting interlayers of the semiconductor device. With the method of the present invention, the deposition of the magnetic material is integrated with the semiconductor manufacturing process.

20 Claims, 6 Drawing Sheets

METHOD OF INCORPORATING MAGNETIC MATERIALS IN A SEMICONDUCTOR MANUFACTURING PROCESS

This is a divisional of application Ser. No. 10/462,722 filed Jun. 17, 2003, now abandoned.

This invention was made with Government support under contract no. N00014-01-2-0009 awarded by the Department of the Navy. The Government has certain rights in the invention.

BACKGROUND

1. Field of the Invention

The present invention generally relates to methods for incorporating magnetic materials in a semiconductor manufacturing process and, more particularly, to methods for integrating a process of depositing magnetic materials during a semiconductor manufacturing process.

2. Background of the Invention

Magnetoelectronics is a growing field that is devoted to the development of electronic device structures that incorporate a ferromagnetic element. Magnetoelectronic devices are most-commonly used as storage devices by exploiting the bi-stable orientation characteristics of ferromagnetic material.

The bi-stable orientation characteristic is a defining characteristic of ferromagnetic materials and a natural basis for nonvolatile bit storage. A properly fabricated thin ferromagnetic film exhibits two possible states of magnetization that can be described by a hysteresis loop. As shown in FIG. 1, when a write current (Iw) is applied to an integrated, contiguous write wire 11 that is directly over a ferromagnetic element 12, a magnetic field (H) is generated that is parallel with and close to a surface of the write wire 11. The magnitude of the magnetic field (H) is determined by an inductive coefficient ($\alpha$) and the write current (Iw), i.e., H=$\alpha$Iw. The magnetization of the ferromagnetic film is a function of the magnetic field and follows a hysteresis loop like that shown in FIG. 2.

More specifically, when the magnetic field is larger than a switching field (Hs), the magnetization of the ferromagnetic film reaches a first saturation value (Ms). The magnetization is thereafter maintained at this first saturation value and particular orientation for periods as long as years, even when power is removed. An output voltage (Vout) of a magnetic sensor in the proximity of the ferromagnetic material is also maintained unchanged until the magnetization is changed to a second saturation value (-Ms). The orientation of the magnetization changes when a magnetic field with a reversed direction is applied to the ferromagnetic element. The magnetization, however, drops down slightly when the reversed magnetic field is applied until the reversed magnetic field is less than -Hs. In this situation, the magnetization and output voltage jump promptly from the first saturation value (Ms, Vout) to the second saturation value (-Ms, -Vout), as shown in FIG. 2. As mentioned above, the magnetization state is maintained at the second saturation value for extremely long periods unless the magnetic field reaches Hs again.

Due to the "latched" or "non-volatile" characteristic of the ferromagnetic element described above, a ferromagnetic element can be maintain at its last state even after a power is removed from a write line. The ferromagnetic element can also be switched between two states in one clock cycle and the switch can be set and reset an infinite number of times. Generally, the switching speed of elements made from common ferromagnetic materials is on the order of a fraction of a nanosecond or even faster. In view of these performance characteristics, magnetoelectronic devices offer the promise of high speed, low power, and radiation hard nonvolatile magnetic memory and instantaneously programmable logic.

Utilization of a ferromagnetic element in an integrated magnetoelectronic device was first disclosed in an article entitled "Hybrid Hall Effect Device" by Mark Johnson et al. in 1997. In Johnson et al.'s prototype, a single microstructured ferromagnetic film and a micro scale Hall cross are fabricated together to create a magnetoelectronic device. Magnetic fringe fields from the edge of the ferromagnet generate a Hall voltage in the Hall cross. The sign of the fringe field, as well as the sign of the output Hall voltage, is switched by reversing the magnetization of the ferromagnet. The Hall cross thus detects the Hall voltage and outputs a value (high or low) corresponding to the direction of the magnetization of the ferromagnet.

Magnetoelectronic programmable logic to execute a Boolean operation can be devised utilizing Johnson's basic idea. FIG. 3 is a schematic diagram of an ideal magnetoelectronic programmable logic gate, which comprises two input terminals, A and B, one control terminal C, and separate terminals for bias and readout. Binary input pulses may be applied simultaneously to input terminals A and B, or the control terminal C. Each logic gate is constructed from a ferromagnetic material and associated Hall sensor. The ferromagnetic material is patterned from a thin magnetic film in such a way that a square hysteresis characteristic can be obtained. The up or down polarization of the magnetic material is detected by the Hall sensor as a high ("1") or low ("0") voltage. The logic gate is designed in a manner such that the saturation value of magnetization of the hysteresis loop can be reached only when at least two of the three terminals A, B and C are high inputs. Therefore, when a zero amplitude is applied to control terminal C(C=0), high inputs at terminals A and B are required to switch the gate state, and, accordingly, the logic gate operates as an AND gate. If a unit amplitude pulse is applied to C(C=1), then a single unit pulse at either A or B is necessary and sufficient to switch the gate state, and, accordingly, the logic gate operates as an OR gate. Two other Boolean functions, "NOR" and "NAND", can be achieved by programming the bias current of the Hall sensor in an opposite direction. As mentioned, for a device like that shown in FIG. 3, Boolean operation requires only two clock steps for completion, one to set the initial device state and the second to sum input write currents. The result is then "latched" so that it can be read out at any later time.

FIG. 4 is a logic table showing that the programmable logic gate of FIG. 3 performs AND and NOR operations when C=1, and OR and NAND operation when C=0.

Exemplary electrical circuitry for achieving the logic gate of FIG. 3 is shown in FIG. 5, in which a VRESET voltage is used to reset the magnetization of a magnetic material to a known state. The logic operation starts with setting a set voltage, VSET, high. Then the input voltages VA, VB and VC switch parallel FETs X2-X8, X3-X7 and X4-X6 on or off, thus generating a write current in a metal strap that is positioned just above the magnetic material (not shown). The write current generates a magnetic field in the magnetic material and traverses the flux versus field hysteresis curve. The magnetic flux flows through active areas of the Hall sensor and generates voltages, corresponding to the vertical axis in FIG. 2. The Hall sensor thus detects the polarization of the magnetic material and outputs "1" or "0" in response to the detection.

In known magnetoelectronic devices, the ferromagnetic structures utilized to perform the bi-stable non-volatile function described have typically included giant mangetoresistance (GMR) structures and magnetic tunnel junctions (MTJ) structures. GMR structures are composed of all-metal ferromagnet-nonmagnetic-ferromagnet laminates that are typically low impedance devices, but require large bias current densities to achieve adequate output levels. MTJ structures are ferromagnet-insulator-ferromagnet structures with high impedance and bias-dependent output. In MTJ structures, output levels of tens of mV can be achieved with hundreds of mV bias, but the device impedance and output are extremely sensitive to the thickness of the insulator layer, and operation regions are difficult to control. Furthermore, GMR and MTJ structures both require two ferromagnetic films, and issues of magnetic coupling between layers impose further limits on their fabrication and yield of the resulting magnetoelectronic integrated circuits. Moreover, GMR and MTJ are distinct structures and cannot be readily manufactured during a semiconductor device manufacturing process.

As the competition in the magnetoelectronics market increases, there is a demand to reduce the volume of the ferromagnetic structure, simplify its manufacturing process, and better integrate it with a semiconductor manufacturing process.

SUMMARY OF THE INVENTION

Accordingly, one object of the present invention is to provide a method for combining the manufacturing processes for a semiconductor device with that of a ferromagnetic device. In accordance with the present invention, the steps for manufacturing the ferromagnetic device are carried out after the steps for manufacturing a semiconductor device are substantially completed. As a result, no significant modifications to the semiconductor process are needed.

The present invention is particularly useful in combining ferromagnetic material in a CMOS manufacturing process. This is significant in that CMOS devices are inexpensive, fast and perform the basic functions of memory function and logic and serve as focusing means for detecting of magnetic field. The magnetic field strength as seen by a sensor, e.g., Hall sensor, can be amplified several times with a magnetic film positioned judiciously with respect to the sensor. Some of the functions implemented on chip may include: operational amplifiers, ring oscillators, electrostatic damage diodes, bit select for memories, analog to digital converters, capacitors, resistors and so on.

In accordance with one embodiment of the present invention, a method for combining a magnetic device in a semiconductor process comprises manufacturing a semiconductor device including interlayers, forming magnetic elements on a top surface of semiconductor devices, depositing a dielectric layer on a top surface of the magnetic elements, and forming via holes and contacts on a top surface of the dielectric layer for connecting the interlayer.

Features of the present invention include depositing a dielectric underlayer on top of substantially completed semiconductor devices, and depositing a silicon nitride ($Si_3N_4$) seed layer on top of the dielectric underlayer. The dielectric underlayer preferably comprises a structure of TEOS/SOG/BSPG having a thickness of about 4000 Å. The seed layer preferably has a thickness of about 1000 Å.

In accordance with an aspect of the present invention, magnetic materials are deposited during a semiconductor manufacturing process, but after the semiconductor devices are substantially completed. The magnetic elements are formed by depositing a layer of magnetic material on a top surface of semiconductor devices or dielectric underlayer, depositing a silicon nitride layer on top of the layer of magnetic material, patterning the magnetic layer by etching off portions of the silicon nitride, and etching the magnetic material where the SiN was stripped away. Thus, silicon nitride (which is not etched off in the patterning step) is used as a mask to form the magnetic elements.

One type of magnetic material that can be used in the present invention is CoFe with a ratio of Co to Fe of 0.9:0.1. The thickness of the magnetic material layer is preferably between about 600 Å and 2400 Å. The silicon nitride layer preferably has a thickness of up to about 2800 Å depending on the thickness of magnetic material. The thickness of SiN should be slightly larger than the thickness of magnetic material to ensure that the SiN mask is never etched completely away before the unwanted magnetic material is removed.

Another aspect of the present invention includes depositing a CrSi layer before depositing a silicon nitride layer. The CrSi layer functions as an etching end point during the patterning step and has a thickness of about 200 Å.

The present invention further preferably includes depositing a dielectric layer after magnetic elements are formed, but before the via holes and contacts, which are used to connect interlayers of the semiconductor devices, are formed. The dielectric layer which encompasses the magnetic elements preferably comprises TEOS/TEOS and has a thickness of about 4000 Å. The magnetic dielectric layer may also comprises a structure of TEOS/SOG/TEOS having a thickness of about 4000 Å.

The present invention further provides a magnetoelectronic semiconductor device comprising a semiconductor device including interlayers, a Hall sensor formed in association with the semiconductor device, a layer of magnetic material, and contacts for connecting the interlayer and metal wirings for the semiconductor device. The magnetic material is preferably formed before the contacts are formed and is positioned at a distance sufficiently close to the Hall sensor such that a sufficient amount of magnetic flux from the magnetic material can reach and be detected by the Hall sensor.

DETAILED DESCRIPTION OF THE PREFERRED EMBODIMENT

In accordance with the present invention, a method for manufacturing ferromagnetic elements is integrated with a manufacturing process for a semiconductor device. A Hall sensor associated with the ferromagnetic elements may be formed in a semiconductor device below the ferromagnetic elements to detect the polarization of the ferromagnetic elements. The ferromagnetic elements can be formed with ferromagnetic materials or magnetic materials. The semiconductor device is preferably CMOS, but could also comprise bipolar transistors or other types of semiconductor devices such as operational amplifiers, ring oscillators, electrostatic damage diodes, bit select for memories, analog to digital converters, capacitors, resistors, and so on. In the following description, for purposes of explanation, the present invention is described in association with an exemplary CMOS manufacturing process and the ferromagnetic elements are formed of magnetic materials.

FIGS. 6-12 are cross-sectional views showing a series of steps for integrating a magnetic material in a CMOS manufacturing process in accordance with a preferred embodiment of the present invention. According to one embodiment of the present invention, the magnetic material is formed after CMOS devices are substantially completed. In an alternative embodiment, the magnetic material is formed before contacts, which are used to connect interlayers of the CMOS devices, are formed.

Figure 6:
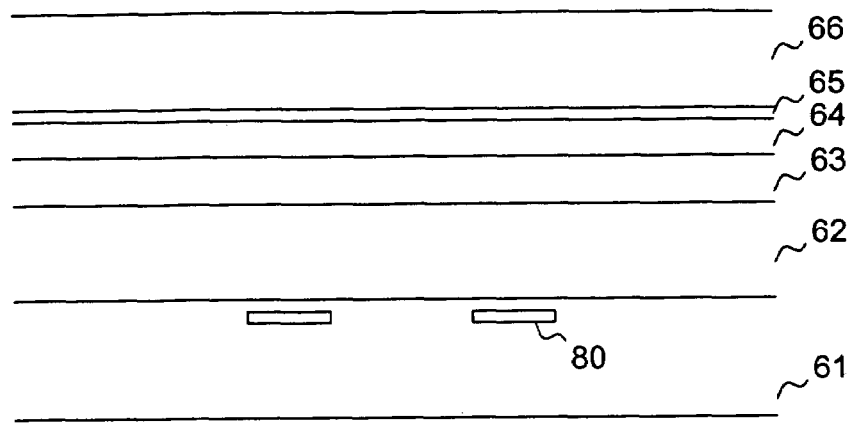
FIGS. 6-12 are schematic cross-sectional views of formation of a CMOS device with integral ferromagnetic material in accordance with a preferred embodiment of the present invention.

FIG. 6 is a cross-sectional view showing that after a CMOS front end process is completed (represented by semiconductor underlayer 61), which may include steps of forming a gate, a drain and a source of a CMOS cell, a dielectric underlayer (e.g. contact glass) 62 is deposited above the semiconductor underlayers 61. A Hall sensor 80 is preferably formed in connection with the CMOS front end process. In another embodiment of the present invention, a $CoSi_2$ layer (not shown) can be formed before the contact glass layer 62 is deposited.

Contact glass 62 may comprise a TEOS (tetraethoxysilicate) layer, a SOG (spin on glass) layer and a BPSG (borophosphosilicate glass) layer. One embodiment of the present invention comprises a TEOS layer of about 500 Å and a SOG layer of about 3000 Å. After annealing the SOG layer, a BPSG layer of about 500 Å is deposited on the SOG. In a preferred implementation, a reflow process is subsequently performed to planarize the surface of dielectric underlayer 62 and to provide a smooth basis for deposition of a magnetic layer 64. The composition of dielectric underlayer 62 is not limited to the TEOS/SOG/BPSG structure. Other structures having similar functionality, such as TEOS/SOG/TEOS, TEOS/TEOS/BPSG and so on, can also be employed.

Figure 1:
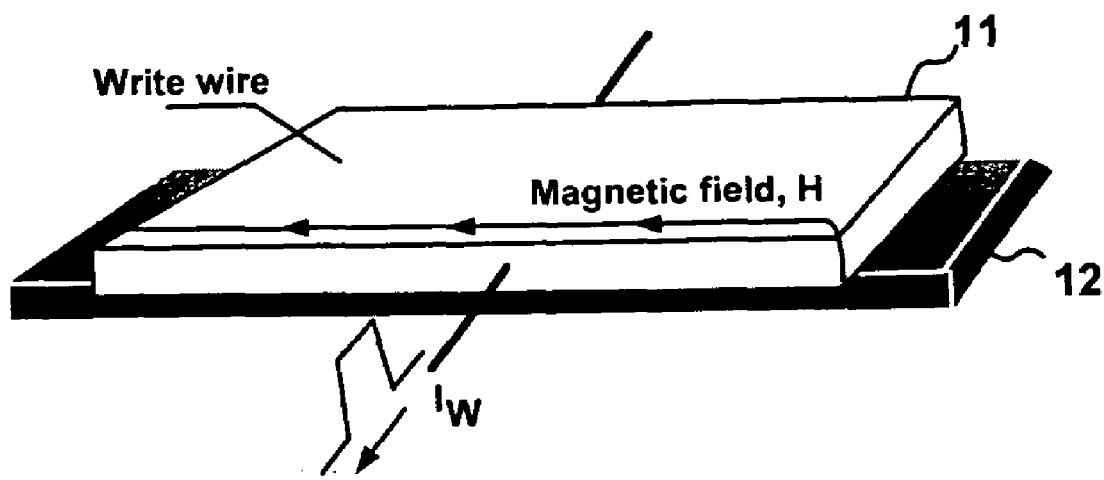
FIG. 1 is a schematic diagram illustrating the magnetic field induced along a surface of a thin ferromagnetic film when a write current is applied to an adjacent conductive layer.
Figure 2:
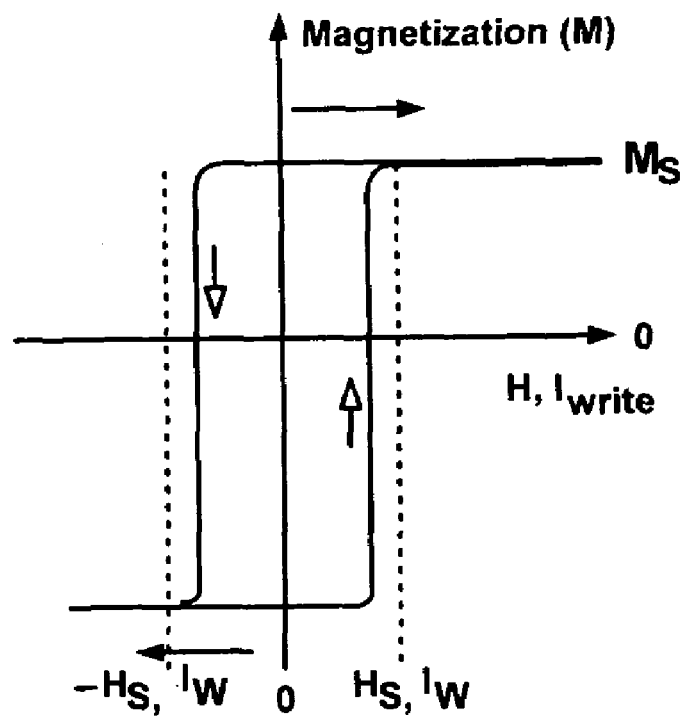
FIG. 2 is a diagram showing a hysteresis loop of a ferromagnetic element.
Figures 3, 4:
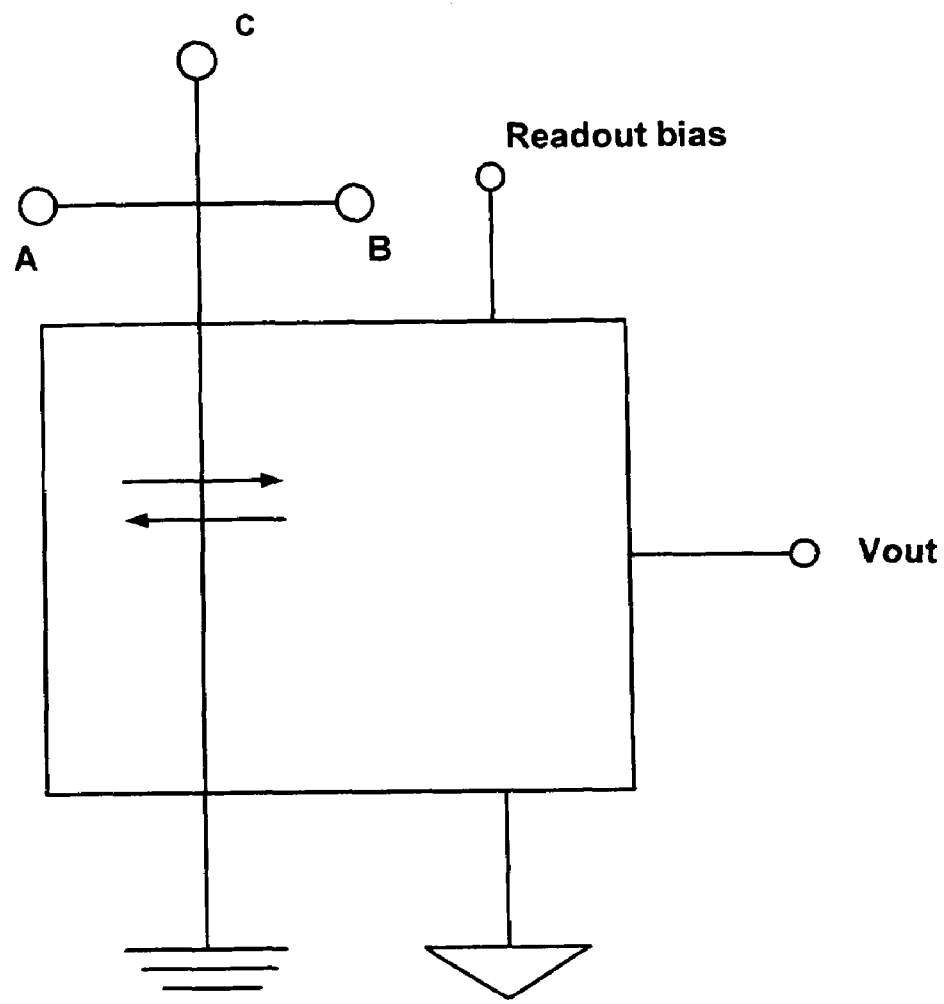
FIG. 3 is a schematic diagram showing an exemplary programmable logic gate of a magnetoelectronic device.
FIG. 4 is a logic table showing Boolean operation results obtained from the programmable logic gate of FIG. 3.
Figure 5:
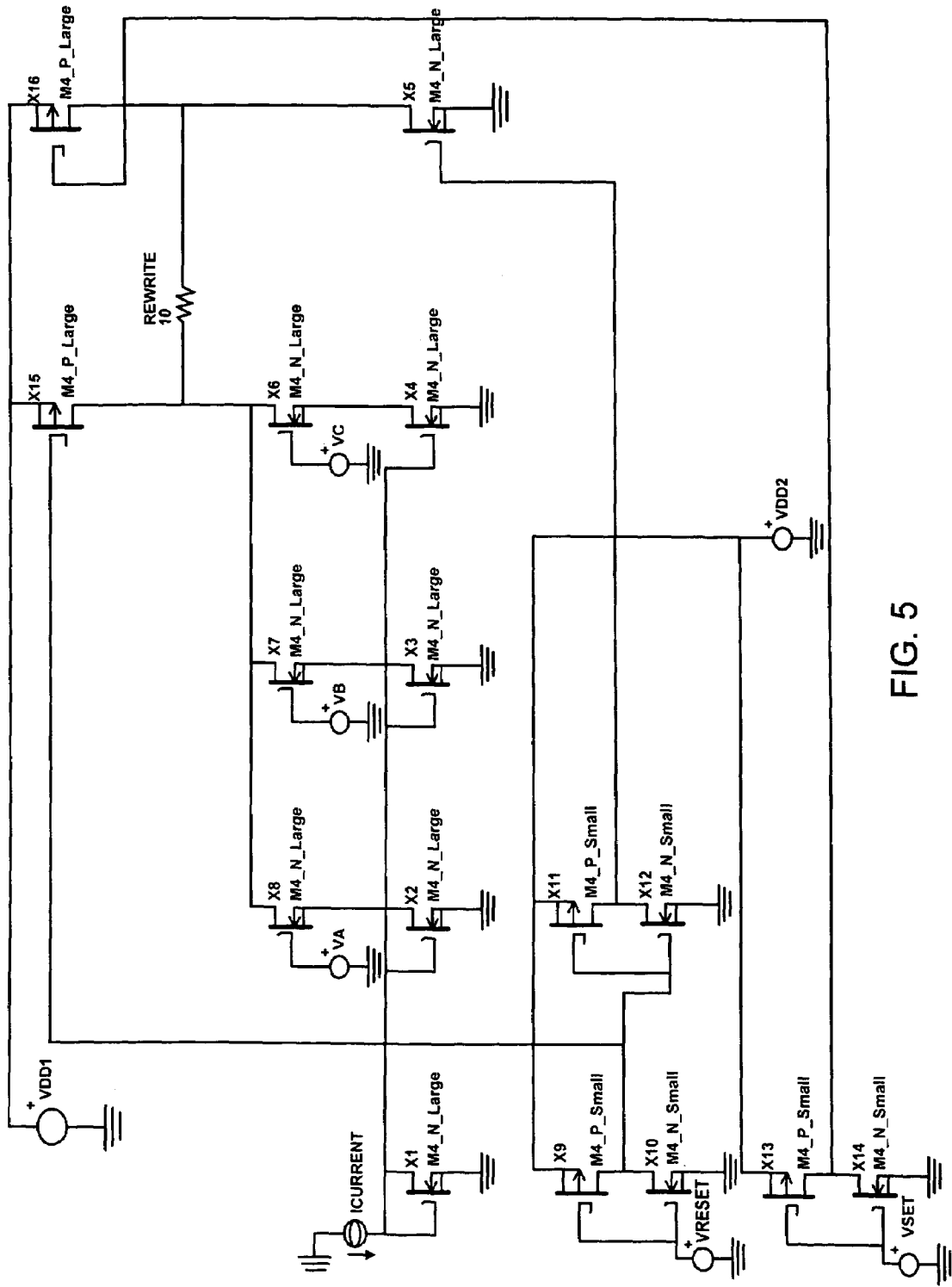
FIG. 5 is a schematic diagram showing exemplary electrical circuitry for implementing the programmable logic gate of FIG. 3.

After dielectric underlayer 62 is formed, a seed layer 63 is deposited on the top of dielectric underlayer 62. Seed layer 63 may be a silicon nitride layer ($Si_3N_4$) of a thickness of about 1000 Å. Next, a magnetic layer 64 of a thickness between about 300 Å and 2400 Å is deposited on the top of seed layer 63. In accordance with the present invention, magnetic layer 64 may be a CoFe layer with the following element ratio: 0.9:0.1. Other ratios of CoFe and other magnetic materials may also be employed, provided that the ratios and/or magnetic materials provide a sufficient magnetic flux and have a coercive field in a range of 10-70 Oe (Oerstead). Magnetic layer 64 also needs to withstand subsequent thermal steps in finishing CMOS process, e.g., annealing without changing or losing the coercive field (switching field), squareness of the hysteresis loop in FIG. 2 and saturation magnetization properties. To obtain improved results, magnetic layer 64 should be close enough to Hall sensor 80 (which may be formed in CMOS underlayer 61) so that a sufficient amount of magnetic flux from magnetic layer 64 can reach and be detected by Hall sensor 80. As described above, as the magnetic material has a characteristic of a square hysteresis loop, the cooperation of the Hall sensor and the magnetic layer 64 facilitates programmable functions, such as Boolean operations.

Referring still to FIG. 6, a patterning process is performed after the magnetic layer is deposited. For this purpose, a CrSi layer 65 of a thickness of about 200 Å is deposited on the top of magnetic layer 64 and then a silicon nitride ($Si_3N_4$) layer 66 up to about 2800 Å is deposited on CrSi layer 65.

Figure 7:
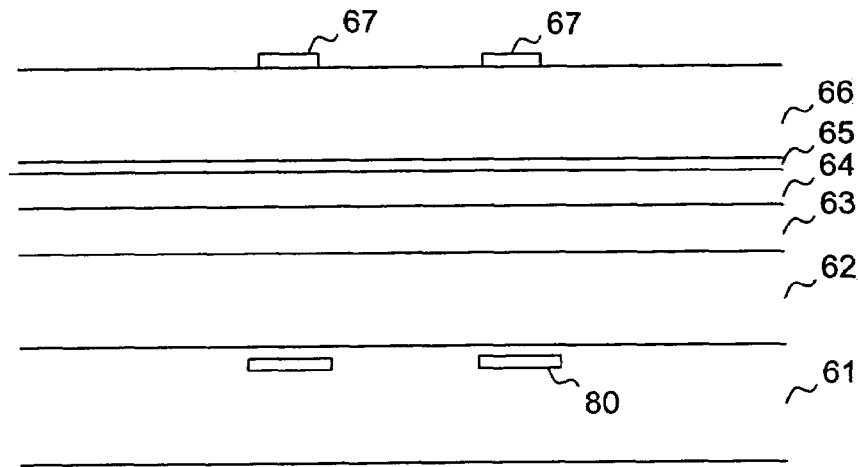

With reference to FIG. 7, an etching step is performed to etch away portions of silicon nitride layer 66 with photoresist 67 covering the portions of magnetic layer 64 to remain. Normally, a dry etching process is used to etch the silicon nitride layer 66. Since CrSi layer 65 does not typically react to dry etching, CrSi layer 65 then acts as a hard mask during an ion mill mechanical etch.

Figure 8:
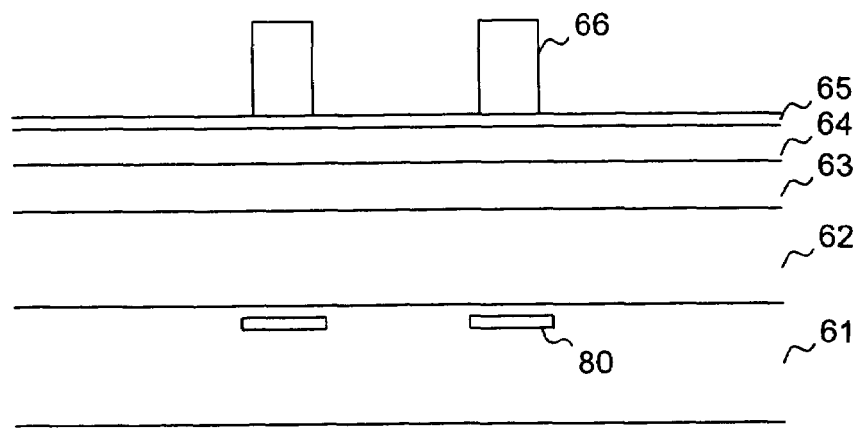

With reference to FIG. 8, after etching silicon nitride layer 66, photoresist 67 is removed. At this point, the patterning process of the magnetic layer mask 64 is completed.

Figure 9:
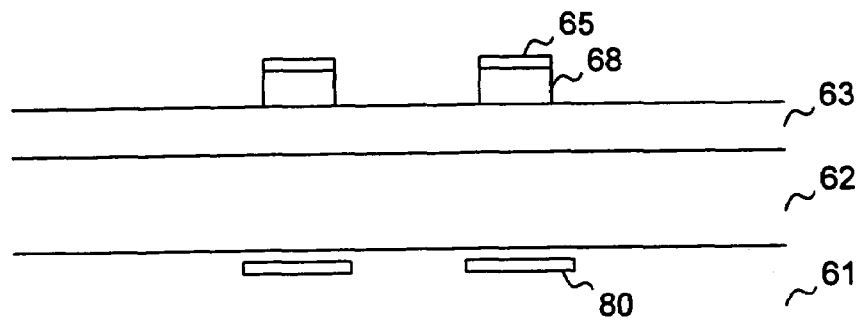

With reference to FIG. 9, a second etching step is performed to etch the etch stop layer 65 and magnetic layer 64. After the etching step, the patterning process of magnetic layer 64 is completed and magnetic elements 68 are formed.

Figure 10:
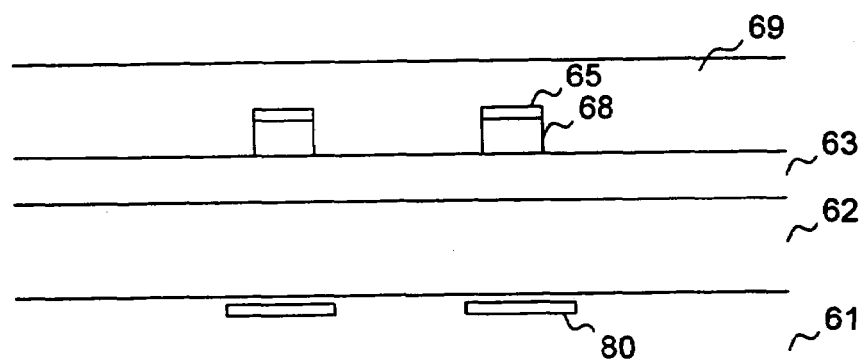

With reference to FIG. 10, a dielectric layer 69 is deposited on the top of magnetic elements 68. In accordance with one embodiment of the present invention, dielectric layer 69 may be formed by depositing a TEOS layer of a thickness of about 1500 Å, depositing a SOG layer of a thickness of about 500 Å and then re-depositing a TEOS layer of a thickness of about 2000 Å, preferably after annealing the SOG. In another embodiment, dielectric layer 69 may be formed by depositing a TEOS layer of a thickness of about 2000 Å, etching back the TEOS of about 500 Å, and then re-depositing a TEOS layer of a thickness of about 3500 Å.

Figure 11:
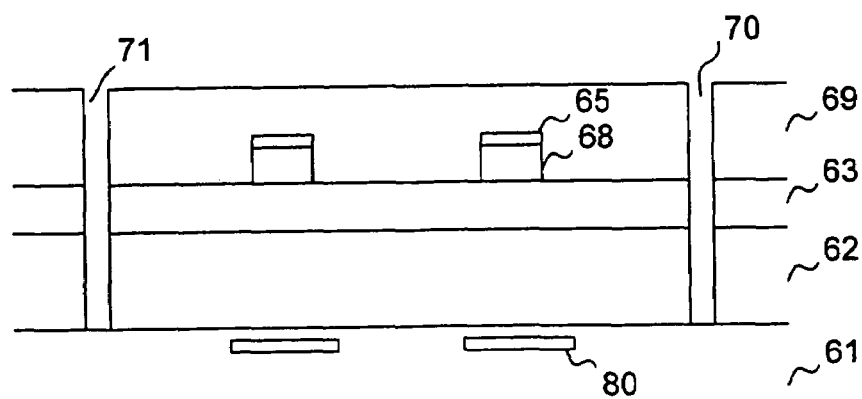

With reference to FIG. 11, via holes 70 are then formed by etching dielectric layer 69, 63 and 62 down to CMOS undelayer 61 so that metallized contacts (e.g. M1 shown in FIG. 12) can be formed in the via holes and contact CMOS underlayer 61. These holes for forming contacts are filled with metal and are used for connecting interlayers of the semiconductor device to the metal wiring (interconnect) layers that are fabricated later in the process.

Figure 12:
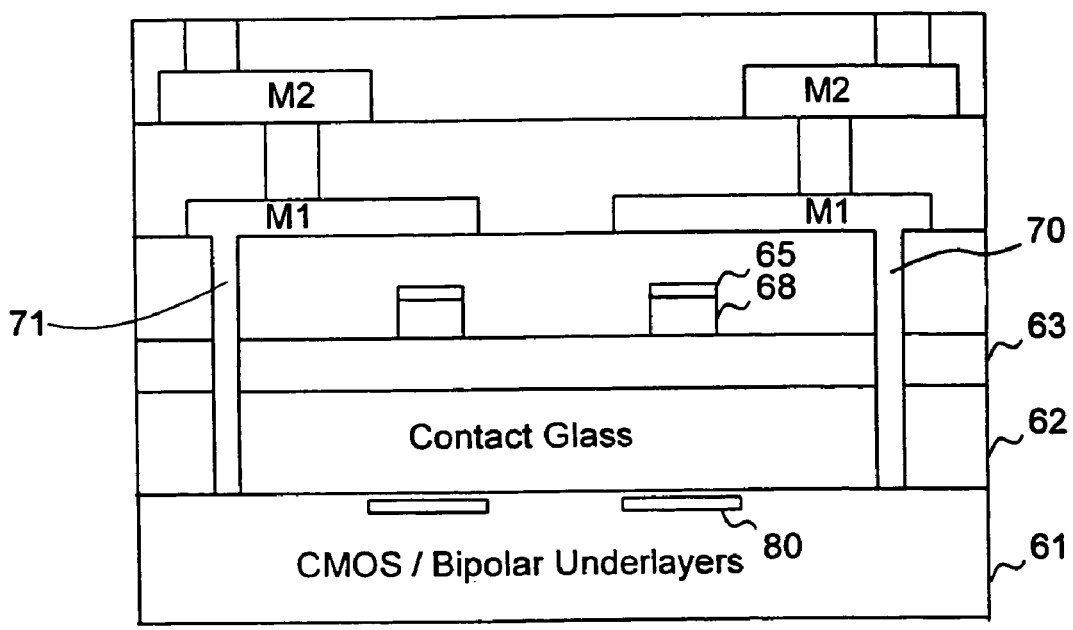

With reference to FIG. 12, a structure including CMOS devices with magnetic materials is shown. FIG. 12 further shows that two layers of metallized interconnects M1 and M2 are formed in combination with via holes 70 and 71.

According to the present invention, the method of integrating magnetic materials with a CMOS manufacturing process provides several advantages including at least non-volatility, scalability, compatibility, durability and high speed. Moreover, by integrating the deposition of magnetic material during a semiconductor manufacturing process, a magnetoelectronic reprogrammable device can be scaled down to submicron and nanoscale dimensions. The method of the present invention also makes it possible to easily integrate magnetic materials with other semiconductor support circuits and with other data processing stages. Further, by integrating the depositing of magnetic material during a semiconductor manufacturing process, the key device parameters of the magnetoelectronic devices, such as impedance, magnetic field flux and so on, can be controlled independently from each other through a design of manufacturing process, such as by controlling a doping concentration and dopants, etc., for the semiconductor device independent from the composition or shape of the magnetic layer.

Furthermore, since the present invention provides a magnetic layer after the main semiconductor device manufacturing process is complete, the invention can be easily employed in various conventional semiconductor manufacturing processes without major modifications to those processes. According to an embodiment of the present invention, the manufacture of the magnetic material is performed after the semiconductor device is complete and before metal contacts for interlayer connections and/or metal wirings are formed. Therefore, the main manufacturing process of the semiconductor device can remain unchanged.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A method for incorporating magnetic elements in a semiconductor manufacturing process, wherein the semiconductor manufacturing process comprises steps for manufacturing semiconductor devices, comprising:
    manufacturing the semiconductor devices;
    forming a layer of magnetic material above the semiconductor devices after the semiconductor devices are formed;
    patterning and etching the layer of magnetic material to form magnetic elements, wherein the patterning and etching comprises:
        depositing a silicon nitride layer on top of the layer of magnetic material;
        etching off portions of the silicon nitride layer in a first etching process; and
        etching the layer of magnetic material in a second etching process which uses remaining silicon nitride which was not etched off in the first etching process as a mask to form the magnetic elements;
    depositing a dielectric layer on a top surface of the magnetic elements; and
    forming via holes and contacts through the dielectric layer to contact the semiconductor devices.

2. The method of claim 1, further comprising, before forming magnetic elements, depositing a dielectric underlayer on top of the semiconductor devices; and depositing a silicon nitride ($Si_3N_4$) seed layer on top of the dielectric underlayer.

3. The method of claim 2, wherein the dielectric underlayer comprises a structure of TEOS/SOG/BSPG, wherein the thickness of the dielectric underlayer is about 4000 Å and the thickness of the seed layer is about 1000 Å.

4. The method of claim 1, wherein the magnetic material is CoFe with a ratio of Co to Fe of 0.9:0.1.

5. The method of claim 1, wherein the magnetic material has a coercive field of 10-70 Oe.

6. The method of claim 1, wherein the layer of magnetic material has a thickness of about 600 Å to about 2800 Å, and the silicon nitride layer has a thickness of up to about 2800 Å.

7. The method of claim 1, further comprising depositing a CrSi layer before depositing the silicon nitride layer.

8. The method of claim 7, wherein the CrSi layer has a thickness of about 200 Å.

9. The method of claim 1, wherein the dielectric layer comprises a structure of TEOS/TEOS and has a thickness of about 4000 Å.

10. The method of claim 1, wherein the dielectric layer comprises a structure of TEOS/SOG/TEOS and has a thickness of about 4000 Å.

11. The method of claim 1, wherein the semiconductor devices are one of CMOS devices and bipolar transistors.

12. A semiconductor manufacturing method, comprising:
    depositing a first dielectric layer over one or more semiconductor devices;
    depositing a first silicon nitride layer over the first dielectric layer;
    forming a layer of magnetic material over the first silicon nitride layer;
    depositing a second silicon nitride layer over the layer of magnetic material;
    etching portions of the second silicon nitride layer to form a mask over the layer of magnetic material;
    etching the layer of magnetic material exposed by the mask to form one or more magnetic elements;
    depositing a second dielectric layer over the one or more magnetic elements;
    forming a via hole through the second dielectric layer to the one or more semiconductor devices; and
    depositing a metal material in the via hole to provide a contact to the one or more semiconductor devices.

13. The method of claim 12, wherein the first dielectric layer comprises a structure of TEOS/SOG/BSPG.

14. The method of claim 12, wherein the magnetic material comprises CoFe.

15. The method of claim 12, wherein the magnetic material comprises permalloy.

16. The method of claim 12, wherein the layer of magnetic material has a thickness of about 600 Å to about 2800 Å.

17. The method of claim 12, wherein the second silicon nitride layer has a thickness of up to about 2800 Å.

18. The method of claim 12, further comprising depositing a CrSi layer before depositing the second silicon nitride layer.

19. The method of claim 12, wherein the second dielectric layer comprises a structure of TEOS/TEOS.

20. The method of claim 12, wherein the second dielectric layer comprises a structure of TEOS/SOG/TEOS.

* * * * *